(12) United States Patent
Lu et al.

(10) Patent No.: US 10,692,832 B2
(45) Date of Patent: Jun. 23, 2020

(54) MANUFACTURING METHOD OF SEMICONDUCTOR STRUCTURE

(71) Applicant: TAIWAN SEMICONDUCTOR MANUFACTURING COMPANY LTD., Hsinchu (TW)

(72) Inventors: Chun-Lin Lu, Hsinchu (TW); Kai-Chiang Wu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/017,655

(22) Filed: Jun. 25, 2018

(65) Prior Publication Data

US 2018/0308817 A1    Oct. 25, 2018

Related U.S. Application Data

(63) Continuation of application No. 15/152,274, filed on May 11, 2016, now Pat. No. 10,008,467, which is a
(Continued)

(51) Int. Cl.
*H01L 23/00*    (2006.01)
*H01L 23/498*    (2006.01)

(52) U.S. Cl.
CPC ........ *H01L 24/17* (2013.01); *H01L 23/49838* (2013.01); *H01L 23/49894* (2013.01); *H01L 24/06* (2013.01); *H01L 24/81* (2013.01); *H01L 24/05* (2013.01); *H01L 24/13* (2013.01); *H01L 24/14* (2013.01); *H01L 24/16* (2013.01); *H01L 2224/0401* (2013.01); *H01L 2224/05568* (2013.01); *H01L 2224/05599* (2013.01); *H01L 2224/06517* (2013.01); *H01L 2224/09517* (2013.01); *H01L 2224/10135* (2013.01); *H01L 2224/1134* (2013.01); *H01L 2224/131* (2013.01); *H01L 2224/16237* (2013.01); *H01L 2224/1703* (2013.01); *H01L 2224/17517* (2013.01); *H01L 2224/81139* (2013.01); *H01L 2224/81191* (2013.01);
(Continued)

(58) Field of Classification Search
CPC ............ H01L 29/0696; H01L 29/1095; H01L 29/7813; H01L 33/486; H01L 33/62
USPC ........................................................ 257/737
See application file for complete search history.

(56) References Cited

U.S. PATENT DOCUMENTS

| 6,222,277 | B1 * | 4/2001 | Downes | .................. H01L 24/81 257/738 |
| 6,756,684 | B2 * | 6/2004 | Huang | .................... H01L 23/36 257/712 |

(Continued)

*Primary Examiner* — Andy Huynh
(74) *Attorney, Agent, or Firm* — WPAT, P.C., Intellectual Property Attorneys; Anthony King

(57) ABSTRACT

A method for forming a semiconductor structure includes: providing a semiconductor substrate having a first pad and a second pad on a top surface of the semiconductor substrate; providing a circuit board having an active pad and a non-metallic surface; providing a first solder ball and a second solder ball on the active pad and the non-metallic surface respectively; attaching the first pad and the second pad on the first solder ball and the second solder ball respectively; and reflowing the first solder ball and the second solder ball to form a first bump wetted on the active pad and a second bump not wetted on the non-metallic surface.

20 Claims, 14 Drawing Sheets

Related U.S. Application Data continuation of application No. 14/063,302, filed on Oct. 25, 2013, now Pat. No. 9,355,982.

(52) U.S. Cl.
CPC ............... *H01L 2224/81815* (2013.01); *H01L 2924/00014* (2013.01); *H01L 2924/014* (2013.01)

(56) References Cited

U.S. PATENT DOCUMENTS

| | | | | |
|---|---|---|---|---|
| 2002/0151164 | A1* | 10/2002 | Jiang | ................ H01L 24/03 438/613 |
| 2009/0078745 | A1* | 3/2009 | Wong | .................. B23K 1/0016 228/173.1 |

* cited by examiner

MANUFACTURING METHOD OF SEMICONDUCTOR STRUCTURE

CROSS REFERENCE TO RELATED APPLICATIONS

This application is a continuation of U.S. application Ser. No. 15/152,274, filed on May 11, 2016, which is a continuation of U.S. application Ser. No. 14/063,302, filed on Oct. 25, 2013, which is incorporated by reference in its entirety.

FIELD

The disclosure relates to a structure, and more particularly to a semiconductor structure and a manufacturing method of the semiconductor.

BACKGROUND

Chip scale packages (CSP) are widely adopted for semiconductor chip assemblies in the industry because the component has a smaller size. A popular methodology of manufacturing a CSP component is a technology called surface mounting technology (SMT). The surface mounting technology is a method in which the semiconductor chip is mounted or placed directly on the surface of a printed circuit board (PCB). A semiconductor component made with SMT usually has either smaller bonding wires or no bonding wires at all.

The semiconductor component made with SMT is smaller in size and lower in electrical resistance. During manufacturing of the SMT semiconductor component, a ball grid array (BGA) is a type of packaging used for integrating the semiconductor chip and the printed circuit board. In BGA packaging, a number of solder balls are first disposed on either the pads of the semiconductor chip or the pads of the printed circuit board, and then the semiconductor chip and the circuit board are bonded through the solder balls.

By replacing the wires with the solder balls in the surface mounting component, the resistance and required package space are both reduced. However, similar to the bonding wires of the other packaging process, the reliability of the solder balls affects the manufacturing yield of the surface mounting technology. As such, improvements in the integrity and method for a solder ball to form in a surface mounting component continue to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
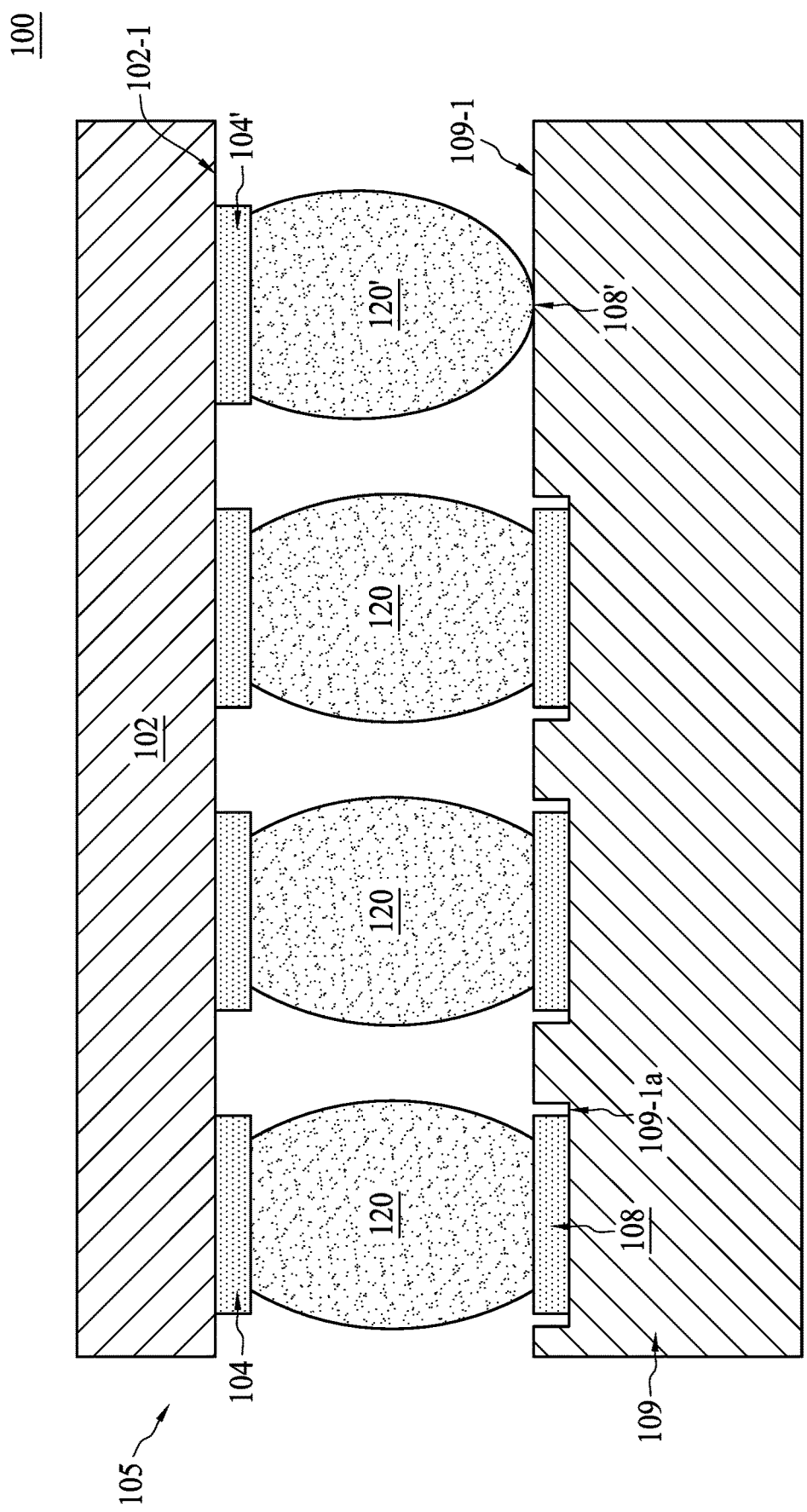
FIG. 1 is a cross sectional view of a semiconductor structure having a bump contacting an electrically insulative top surface on a circuit board in accordance with some embodiments of the present disclosure.

The manufacturing and use of the embodiments are discussed in details below. It should be appreciated, however, that the embodiments provide many applicable inventive concepts that can be embodied in a wide variety of specific contexts. It is to be understood that the following disclosure provides many different embodiments or examples for implementing different features of various embodiments. Specific examples of components and arrangements are described below to simplify the present disclosure. These are, of course, merely examples and are not intended to be limiting.

Further, it is understood that several processing steps and/or features of a device may be only briefly described. Also, additional processing steps and/or features can be added, and certain of the following processing steps and/or features can be removed or changed while still implementing the claims. Thus, the following description should be understood to represent examples only, and are not intended to suggest that one or more steps or features is required.

In addition, the present disclosure may repeat reference numerals and/or letters in the various examples. This repetition is for the purpose of simplicity and clarity and does not in itself dictate a relationship between the various embodiments and/or configurations discussed.

"Bump" is used as the connection member between the semiconductor device and the circuit board after the bonding processes. The different types of bumps are formed using a soldering material, for example, solder balls, or solder pastes.

For a surface mounting component or a chip scale package assembly, solder balls are bonded on the pads of a semiconductor device or a circuit board and form bumps to connect the semiconductor device with the circuit board. Stress distribution inside the bump is an issue. High stress in the corners of the bumps or on the contact surface between the bumps and the pad bonded thereon is causing the bumps to be vulnerable and may cause cracking and a bad electrical connection.

In the present disclosure, a semiconductor structure or a SMT component having a number of bumps are bonded on a semiconductor device and configured to connect the semiconductor device with a circuit board. The bumps are elongated to have a smaller wetting angle with the pads of the semiconductor device or circuit. Each of the elongated bumps is designed to be capable of having a low stress distributed at the corners of the bumps.

A method according to the present disclosure is designed to at least two different types of bumps in a surface mounting component or a chip scale package assembly. The first type is called active bump because the first type bump is conducting electrical current between the circuit board and the semiconductor device. The second type is non-active bump because the second type bump is not electrically connected with any circuitry neither in the circuit board nor the semiconductor device. The second type bump acts as a dummy bump.

In the present disclosure, connection between non-active bump and the circuit board is in non-wetted manner. Active bump is elongated by a non-wetted non-active bump. Active bump is elongated to have a greater aspect ratio than the non-active bump. In some embodiments, an active bump is taller than an adjacent non-active bump.

FIG. 1 is a semiconductor structure 100. In some embodiments, the semiconductor structure 100 is a surface mounting component including a semiconductor device 105 and a circuit board 109. The semiconductor device 105 has a semiconductor substrate 102. A "semiconductor substrate" refers to a bulk semiconductor substrate on which various layers and device structure are formed. In some embodiments, the bulk substrate includes silicon or a compound semiconductor, such as Ga As, InP, Si/Ge, or SiC. Examples of the layers include dielectric layers, doped layers, polysilicon layers or conductive layers. Examples of the device structures include transistors, resistors, and/or capacitors, which may be interconnected through an interconnect layer to additional integrated circuits. Pads 104 are disposed on a top surface 102-1 of the semiconductor substrate 102. Pads 104 are electrically connected to an internal circuit in the semiconductor substrate 102 at one side and electrically connected to an active pad 108 of the circuit board 109 via a bump 120. The pad 108 is disposed on a top surface 109-1 of the circuit board 109. In some embodiments, the top surface 109-1 is not a flat surface as in FIG. 1. The top surface 109 includes some recessed portions 109-1a to accommodate pads 108. The circuit board 109 is designed to mechanically supports and electrically connects electronic components using conductive tracks, pads and other features etched from conductor sheets such as copper, laminated onto a non-conductive substrate. In some embodiments, the circuit board 109 is a printed circuit board (PCB). A PCB populated with electronic components is called a printed circuit assembly (PCA), printed circuit board assembly or PCB assembly (PCBA).

Pads 104 are active pads. Active pad herein means the pad is conductive and located on an electric current path connecting the circuit board 109 and the semiconductor substrate 102. Like in FIG. 1, an active pad 104 on the semiconductor substrate 102 is connecting with a bump 120 whereas an active pad 108 on the circuit board 109 is connected with. Thus, electrical current travels from either active pad 104 or 108 to the other side of the bump 120.

On the contrary, non-active pad means that the pad is not on an electric current path. In some embodiments, it is also called a dummy pad. Referring to FIG. 1, a non-active pad 104' is disposed on the top surface 102-1 but electrically insulated from the internal circuit of the semiconductor substrate 102. The non-active pad 104' is located correspondingly to a contact area 108' on the top surface 109-1 of the circuit board 109. In semiconductor structure 100, the non-active pad 104' is connected to a non-active bump 120'. At the other end of the bump 120', the bump 120' is in contact with an electrically insulative contact area 108', therefore there is no electric current passing through the non-active pad 104' while the semiconductor structure 100 is in operation. In some embodiments, the contact area 108' is a non-metallic surface. In some embodiments, the non-active pad 104' is a metallic layer such that the bump 120' is in contact with the non-active pad 104' in wetted manner.

In some embodiments, the surface of electrically insulative contact area 108' is configured to be unwettable to the bump. In some embodiments, the surface of electrically insulative contact area 108' is a portion of an electrically insulative coating of circuit board 109. The surface is coated with an insulative material that can not provide an adhesive force to overcome cohesive force of the bump when reflowed. The bump maintains a curvature surface at the point contacting with the electrically insulative contact area 108'. Therefore, bump such as 120' is in contact with the contact area 108' in non-wetted manner. There is no any metallic bonding between bump 120' and the contact area 108'. In some embodiments, the insulative material includes Acrylic, Epoxy, Polyurethane, Polyurethane, Silicones. The insulative material is ease of rework and operation in simple drying process, good moisture resistance, chemical resistant, and high dielectric constant.

Pads 108 on the circuit board 109 are designed to include conductive material such as copper, aluminum, gold, silver, or alloys thereof, therefore the top surface of pads 108 provide an adhesive force adequate enough to overcome cohesive force of the bump when reflowed. Thus, the active bump 120 is in contact with the pad 108 in wetted manner. The active bump 120 has a greater contact area surface with pad 108 than the non-active bump 120' with contact area 108'. When a substantially same amount of solder material is applied to form bump 120 and 120', the active bump 120 has a higher aspect ratio than the non-active bump 120'.

Figure 1A:
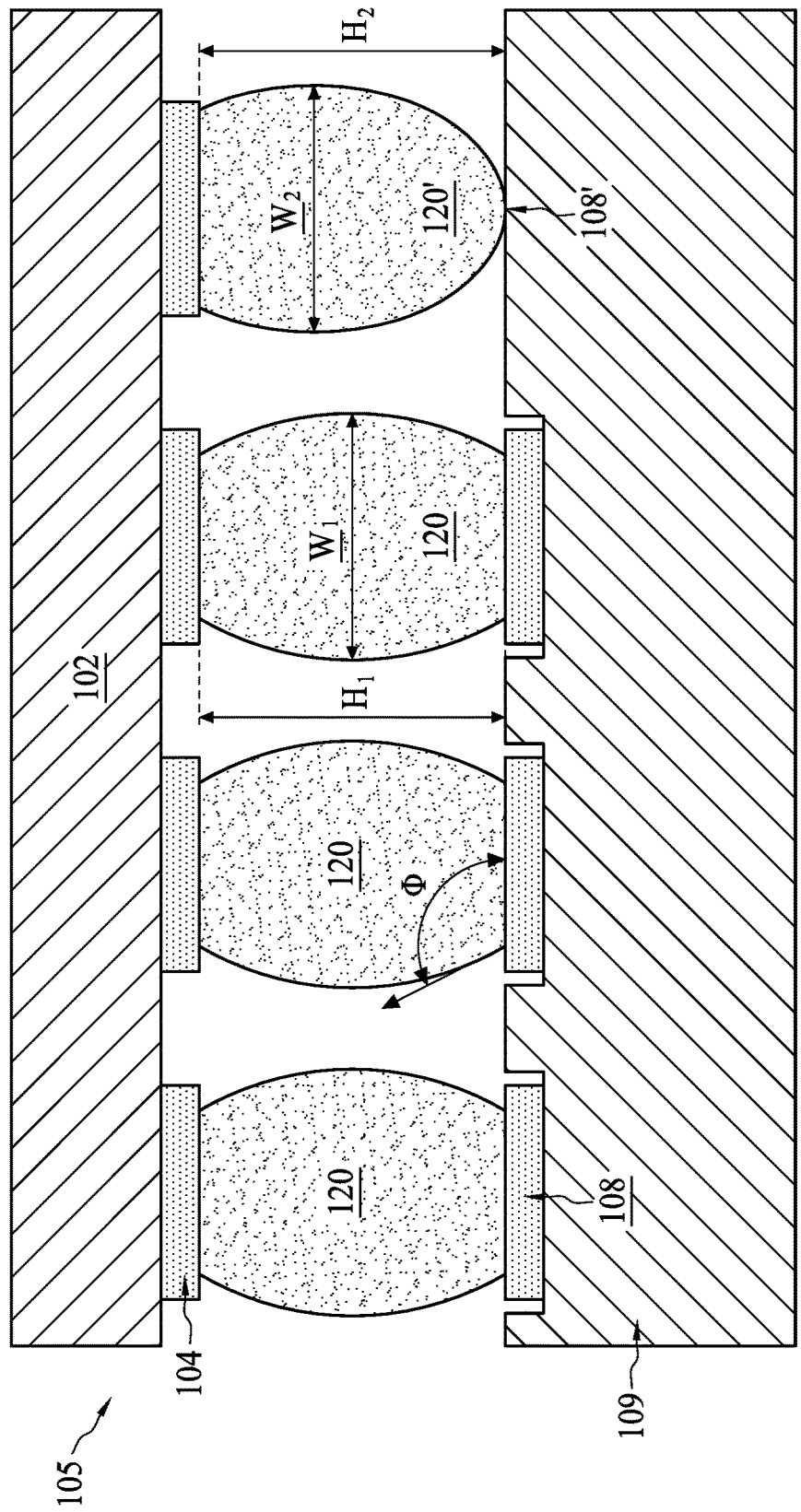
FIG. 1A is a cross sectional view of a semiconductor structure having a bump contacting an electrically insulative top surface on a circuit board in accordance with some embodiments of the present disclosure.

Referring to FIG. 1A, the aspect ratio of each bump is defined as the ratio of the is height of the bump divided by the central width (full width at half height). In some embodiments, solder material between pad 104 and pad 108 is elongated by solder material between pads 104' and 108' during reflow. The non-wetted curvature surface of the solder material on pad 108' increase the gap between circuit board 109 and semiconductor substrate 102. Thus, wetted soldering material is elongated to have a higher aspect ratio and a smaller wetting angle with pad 108. The elongated solder material or bump are more resistant to any crack induced by stress. In FIG. 1A, bump 120 has a height $H_1$ and a central width $W_1$, and bump 120' has a height $H_2$ and a central width $W_2$. The bump 120 has an aspect ratio $H_1/W_1$ and the bump 120' has an aspect ratio $H_2/W_2$. In some embodiments, $H_1/W_1$ is greater than $H_2/W_2$.

The active bump 120 has a wetting angle, $\Phi$, which is the contact angle between the bump 120 and the active pad 108 of the circuit board 109. In some embodiments according to the present disclosure, the wetting angle $\Phi$ is substantially smaller than or equal to 90 degrees. In some embodiments, the wetting angle $\Phi$ is substantially between about 80 degrees and 110 degrees. In some embodiments, the wetting angle $\Phi$ is substantially between about 80 degrees and 130 degrees.

Figure 2:
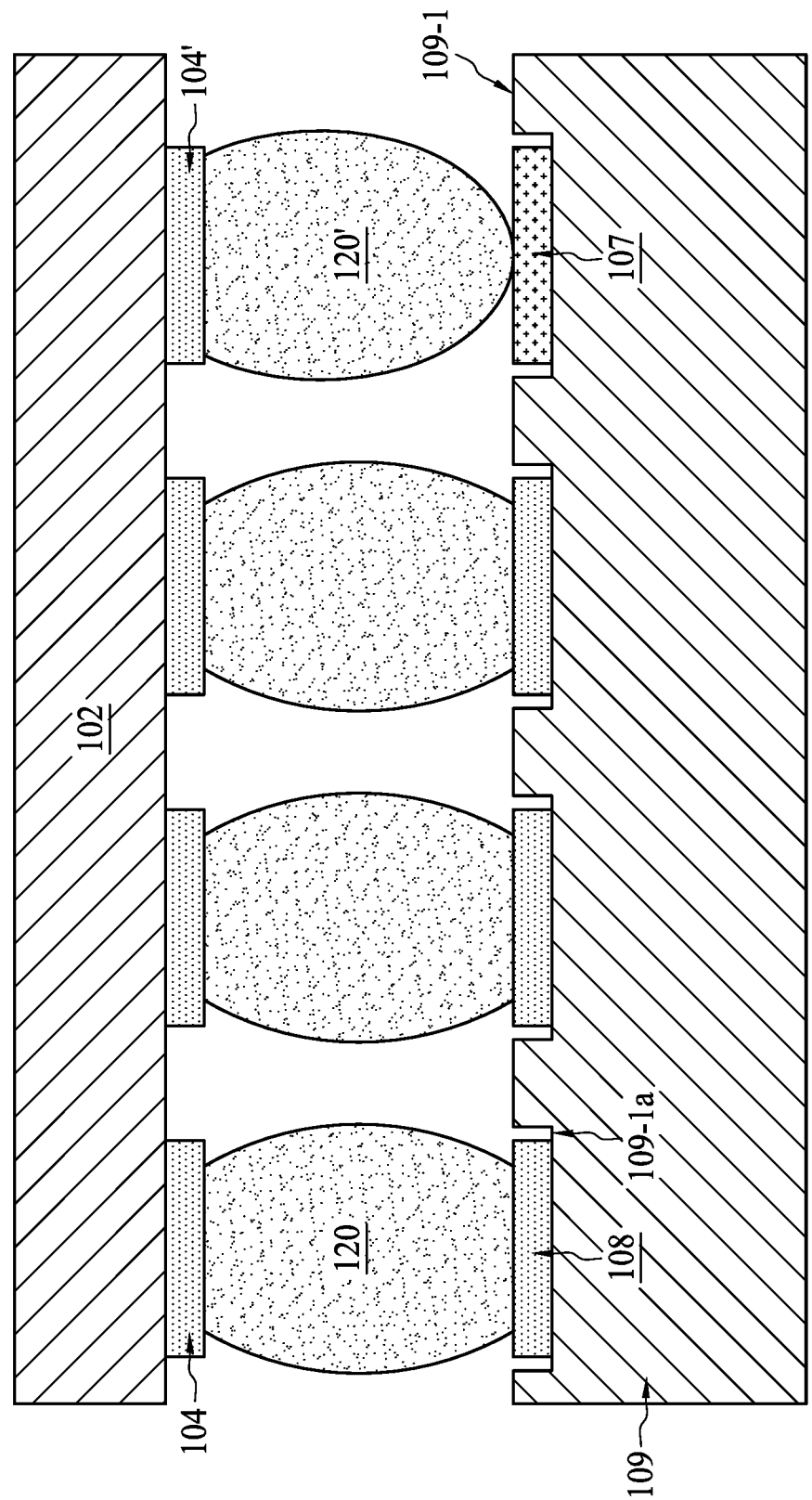
FIG. 2 is a cross sectional view of a semiconductor structure having a bump contacting with an insulative pad on circuit board in accordance with some embodiments of the present disclosure.

According to some embodiments of the present disclosure, the contact area 108' in contact with the bump 120' is an electrically insulative pad. As in FIG. 2, a pad 107 is disposed on surface 109-1. The surface 109-1 includes several substantially identical recessed portions 109-1a and each recessed portion is configured to accommodate either an active pad 108 or a non-active pad 107. In some embodiments, the non-active pad 107 has a same thickness with the active pad 108. However, top surface of the non-active pad 107 includes material not suitable for solder wetting. In some embodiments, the non-active pad 107 includes polymeric material. In some embodiments, the non-active pad 107 includes material such as synthetic rubber, phenol formaldehyde resin (or Bakelite), neoprene, nylon, polyvinyl chloride (PVC or vinyl), polystyrene, polyethylene, polypropylene, polyacrylonitrile, PVB, silicone. The pad 107 is located correspondingly to a non-active pad 104' on the semiconductor substrate 102. Because bump 120' does can not be wetted on the top surface of the non-active pad during reflow, the bump 120' maintains a curvature tip at one end. Bump wetted on pad 108, such as 120, is elongated to have a smaller width than the non-wetted bump 120'. Because both wetted bump 120 and non-wetted bump 120' have a same height, the aspect ratio of wetted bump 120 is greater than the non-wetted bump 120'.

Figure 2A:
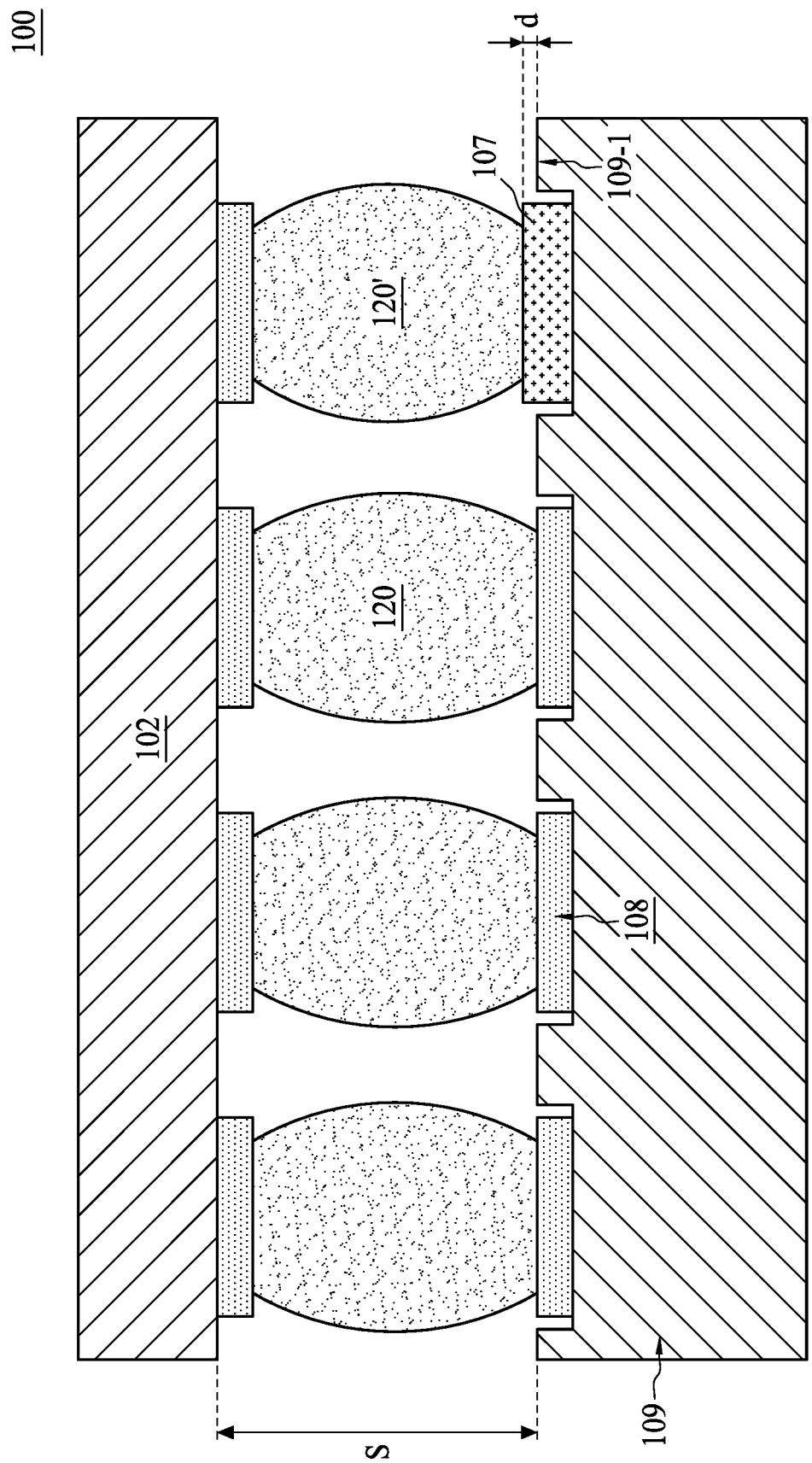
FIG. 2A is a cross sectional view of a semiconductor structure having a bump contacting with an insulative pad in a recessed portion of a circuit board in accordance with some embodiments of the present disclosure.

In some embodiments as in FIG. 2A, the pad 107 on circuit board 109 is thicker than the pad 108. The pad 107 has an extrusion d over the top surface 109-1 of circuit board 109. The extrusion d is between predetermined ranges. In some embodiments, extrusion d is about one tenth of the thickness of the pad 107. In some embodiments, extension d is between about one eighth and one tenth of the thickness of the pad 107.

Figure 3:
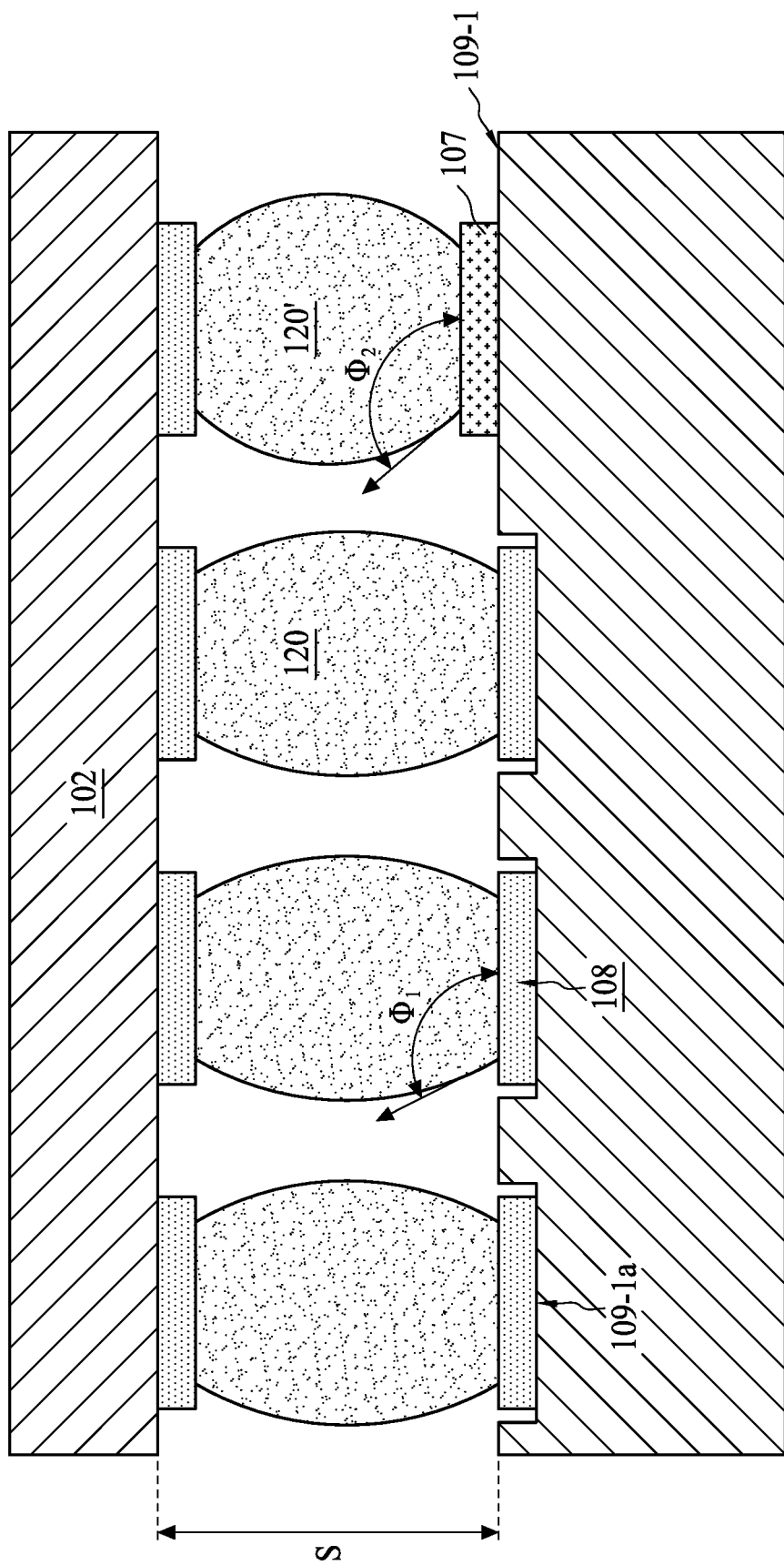
FIG. 3 is a cross sectional view of a semiconductor structure having a bump contacting with an insulative pad on circuit board in accordance with some embodiments of the present disclosure.

In some embodiments as illustrated in FIG. 3, the pad 107 is disposed on a portion of the top surface 109-1 that is at a higher level than the recessed portions 109-1a. In other words, the pad 107 is disposed at a surface that is higher than the active pad 108. Active bumps 120 are in contact with pad 108 in wetted manner, however, the non-active bump 120' is contacting with pad 107 in non-wetted manner. Because the space between semiconductor substrate 102 and circuit board 109 is constrained at a fixed value S, the wetted bump 120 is elongated by non-wetted bumps 120' to have a taller thickness than the non-wetted bump 120'. Moreover, the wetted bump 120 also has a smaller wetting angle $\Phi_1$ than the wetting angle $\Phi_2$ of the non-wetted bump 120'. In some embodiments, $\Phi_1$ is about 10% to 15% smaller than $\Phi_2$. In some embodiments, $\Phi_1$ is about 10% to 30% smaller than $\Phi_2$.

Figure 4:
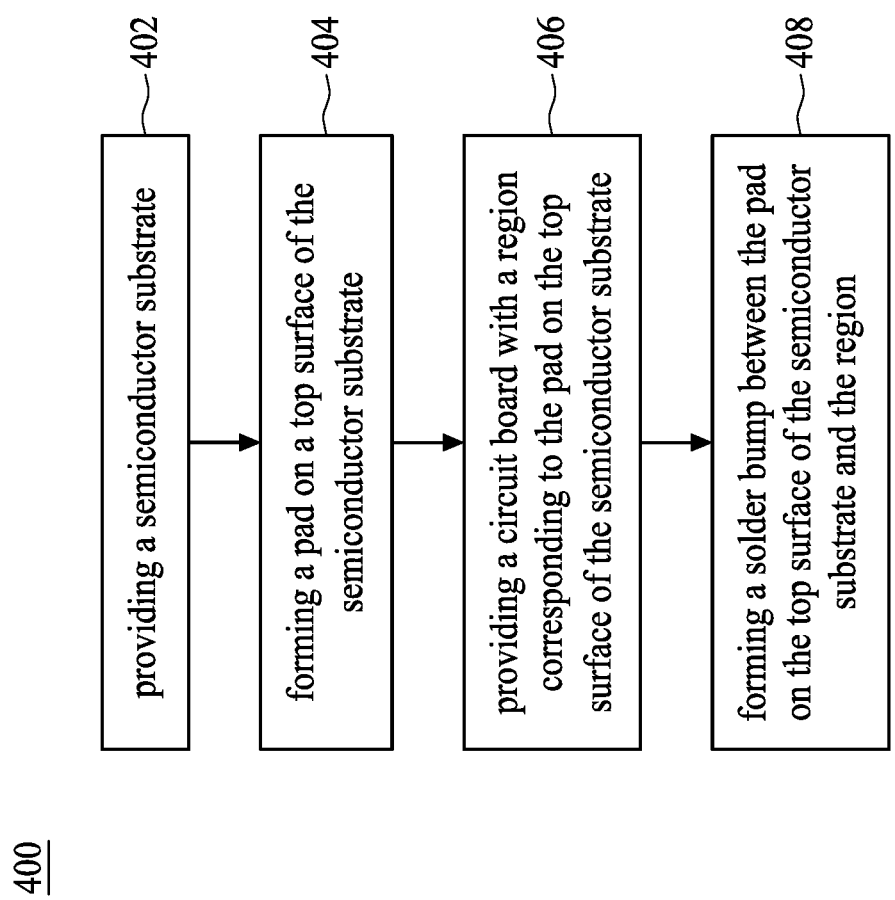
FIG. 4 is a flowchart of a method 400 for fabricating a semiconductor structure bump according to various aspects of the present disclosure.

FIG. 4 is a flowchart of a method 400 for fabricating a semiconductor structure with non-wetted bump according to various aspects of the present disclosure. The method 400 includes operation 402 in which a semiconductor substrate is provided. The method 400 continues with operation 404 in which a pad is formed on a top surface of the semiconductor substrate. The method 400 continues with operation 406 in which a circuit board is provided. On the circuit, a contact area corresponding to the pad on the semiconductor substrate is provides. The method 400 continues with operation 408 in which a bump is formed between the semiconductor substrate and the circuit. The bump contacts the contact area provided on the circuit board in non-wetted manner. The various operations of FIG. 4 are discussed below in more detail in association with cross sectional or top views corresponding to the operations of the flow diagram.

Figure 5A:
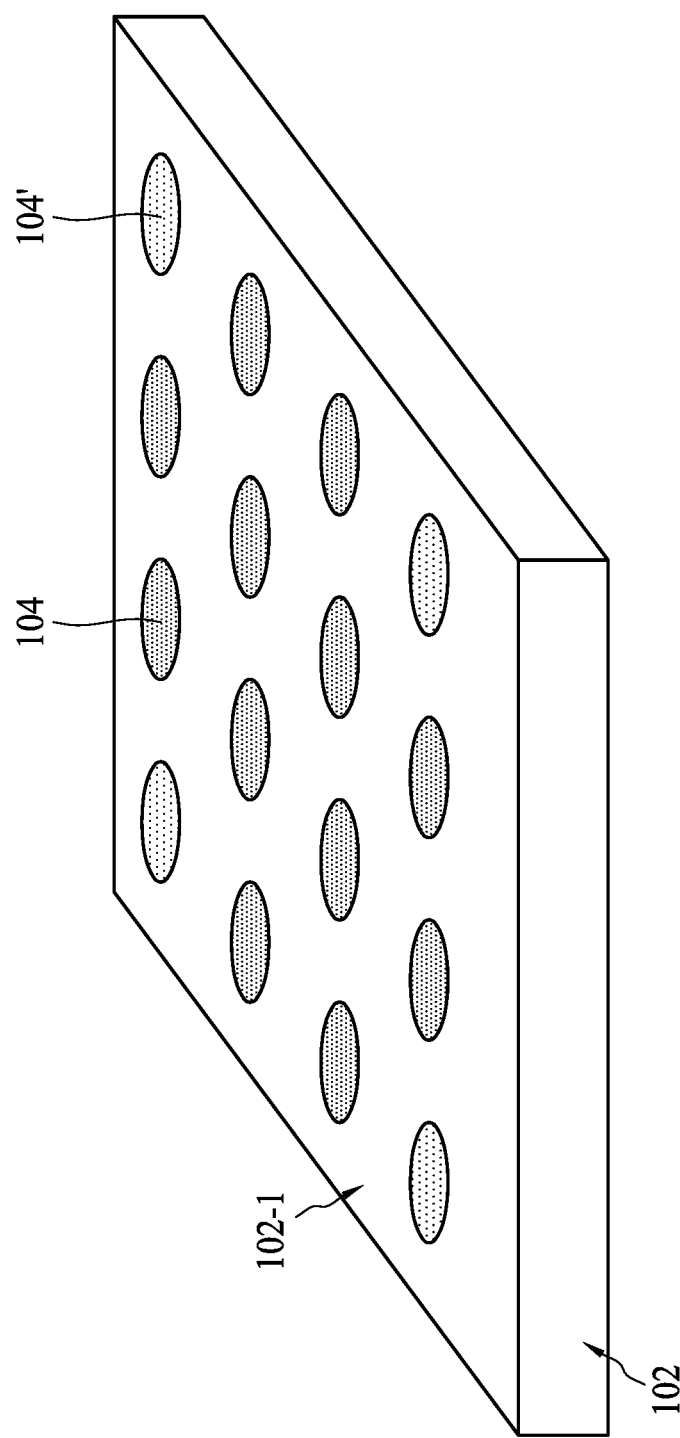
FIGS. 5A to 5E are perspective views of a method of forming a semiconductor structure in accordance some embodiments of the present disclosure.

In FIG. 5A, a semiconductor substrate 102 is provided. Several pads (104, 104') are formed on a top surface 102-1 of the semiconductor substrate 102. The pads are arranged in an array. In some embodiments, pads are designed for a SMT ball grid array (BGA) package. Some pads like 104 are active pads and some pads like 104' are non-active or dummy pads. For a better identification, active pads 104 and non-active pads 104' are drawn in different patterns. However, the pattern difference should not be deemed as a restriction to the present disclosure.

Figure 5B:
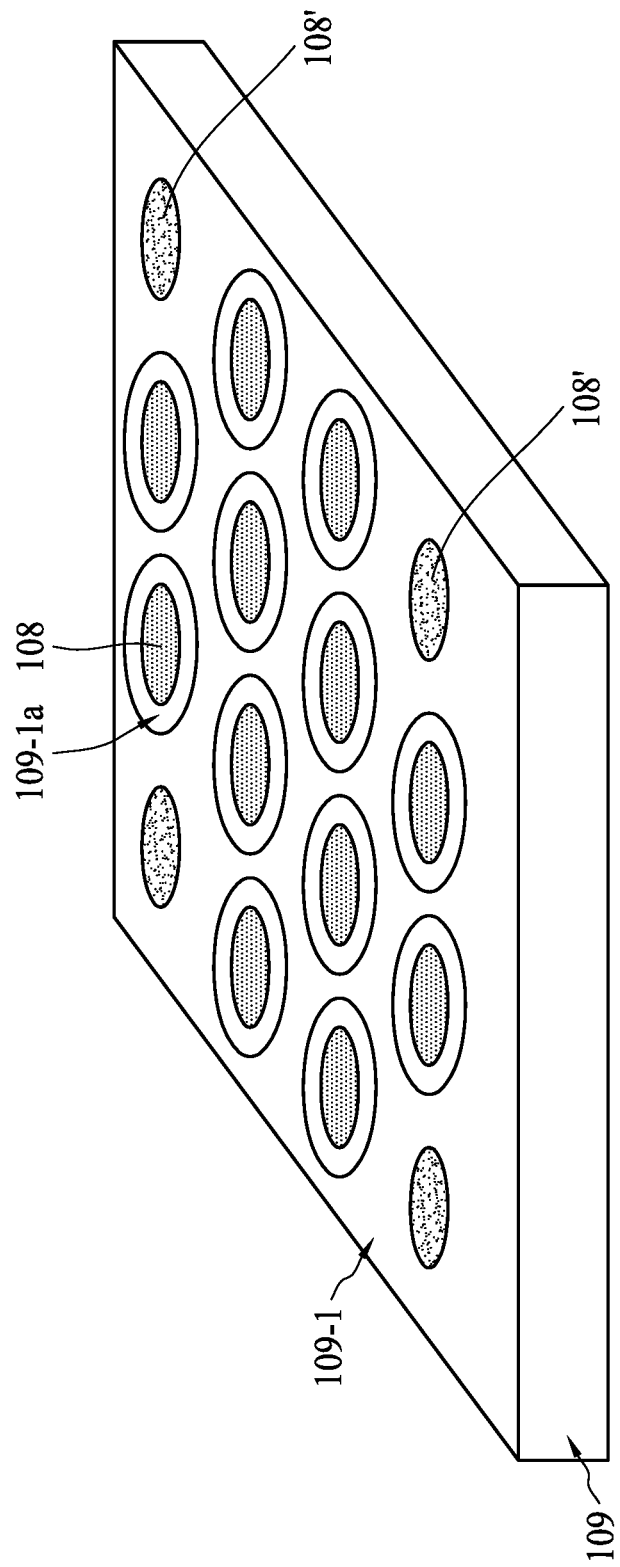

In FIG. 5B, a circuit board 109 is provided. On a top surface 109-1 of the circuit board 109, there are several non-metallic contact areas 108' are designed correspondingly to the non-active pad 104' in FIG. 5A. The circuit board 109 also has some recessed portions 109-1a, which are designed to accommodate active pads 108. The distribution pattern of the active pads 108 on circuit board 109 is corresponding to the distribution pattern of the active pads 104 on the semiconductor substrate 102 in FIG. 5A. In some embodiments, the contact area 108' is a part of the top surface 109-1 hence that is not distinguishable from the top surface 109-1. Dotted line is used to mean that the boundary between the contact area 108' and the top surface 109-1 may be invisible for some embodiments.

Figure 5C:
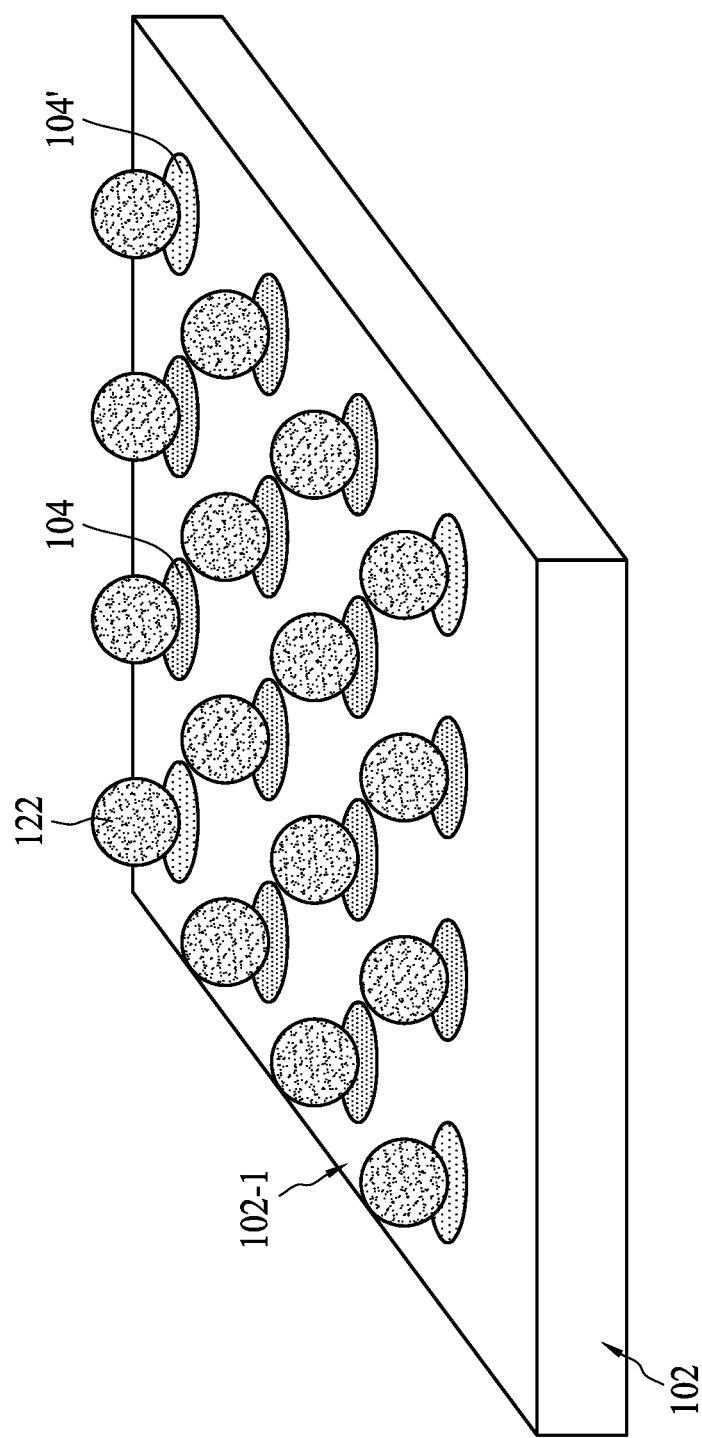
Figure 5D:
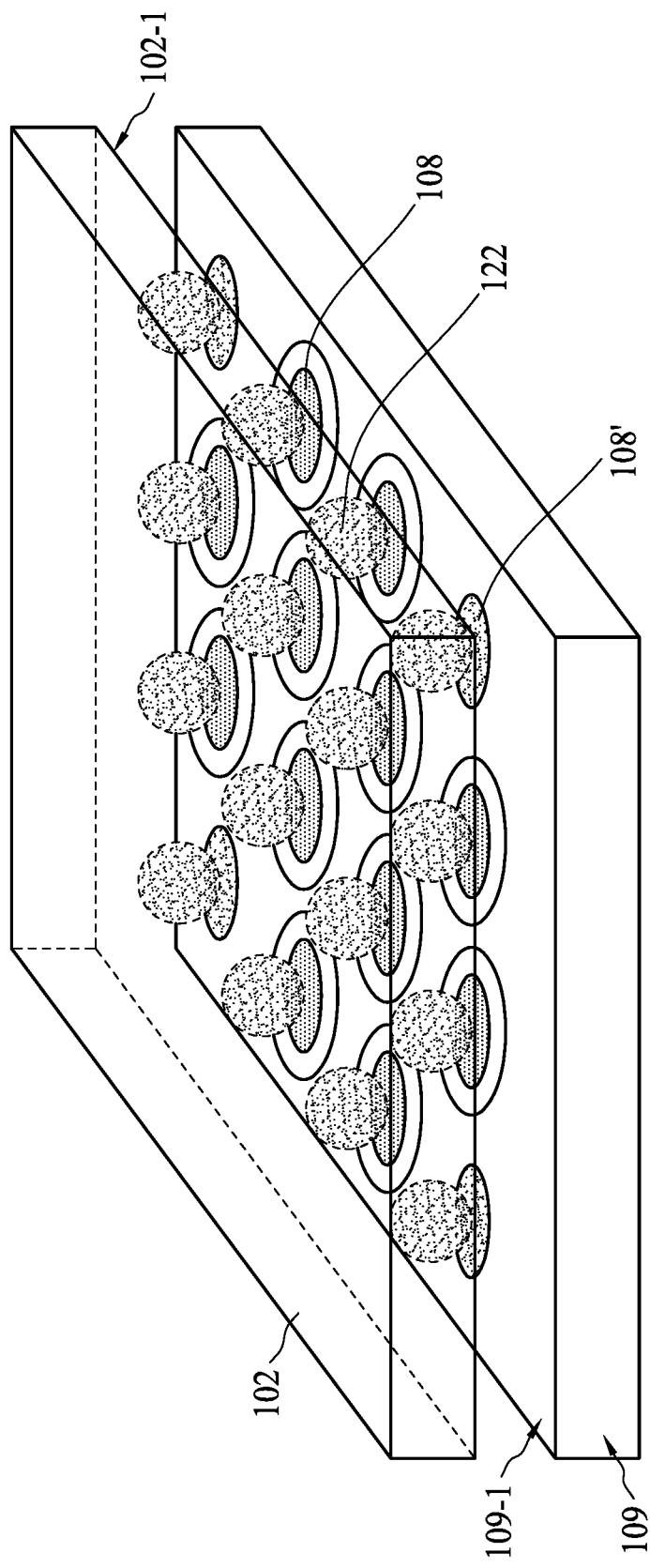

According to some embodiments, solder balls 122 are placed on pads 104 and 104' as in FIG. 5C. The placement is performed in various manners, such as ball drop, stencil. Some operations such as flux pasting are skipped herein. The solder balls 122 are reflowed in order to be bonded on the top surface of the pads 104 and 104'. In FIG. 5D, the semiconductor substrate 102 is flipped to have its top surface 102-1 facing the top surface 109-1 of circuit board 109. Each solder ball 122 bonded with a pad 104 or 104' is contacting a corresponding location of circuit 109. For example, a solder ball 122 bonded on an active pad 104 (not visible) is in contact with an active pad 108; a solder ball bonded on a non-active pad 104' is in contact with a contact area 108'.

Figure 5E:
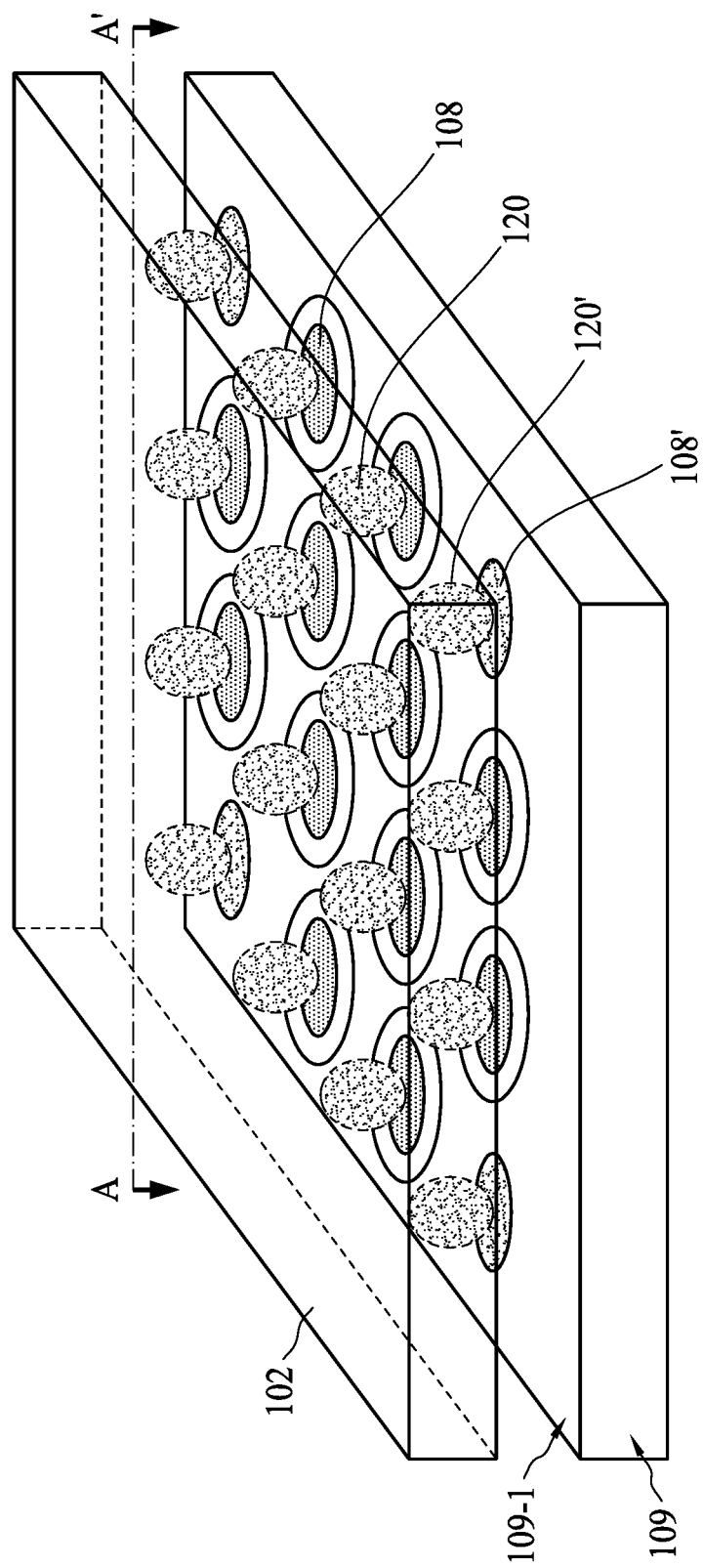
Figure 6:
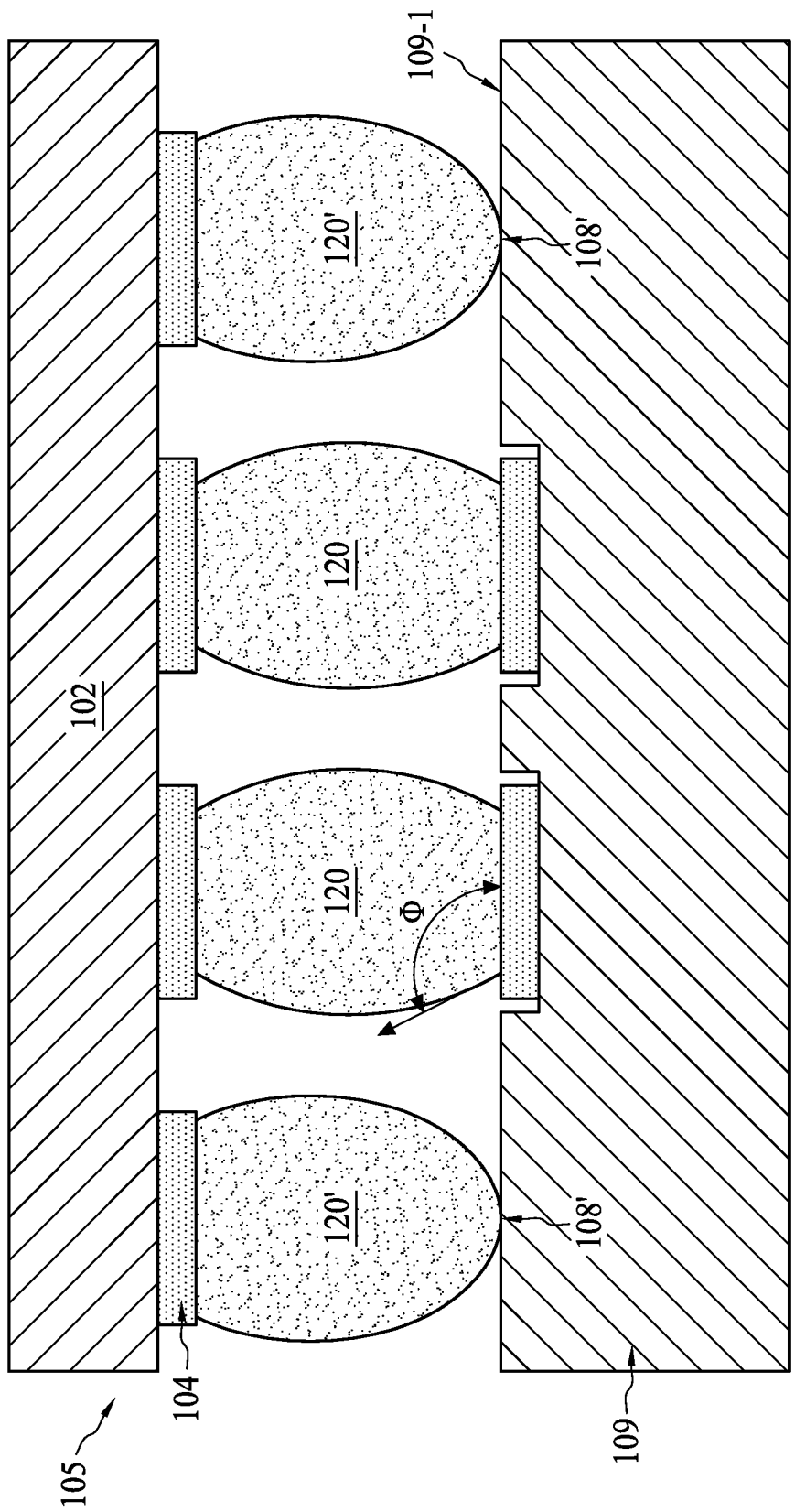
FIG. 6 is the cross sectional view along line AA' in FIG. 4E in accordance some embodiments of the present disclosure.

A reflow is performed to have solder balls 122 bonded with the active pads 108. In FIG. 5E, solder balls are heated to become bumps 120 and 120'. Solder balls contacting with active pads 108 are bonded in wetted manner, however, solder balls contacting with contact areas 108' are not bonded since the solder material can not be wetted on the surface of the contact area 108'. FIG. 6 is a cross sectional view along line AA' in FIG. 5E. There are two wetted bumps 120 between two non-wetted bumps 120'.

Figure 7:
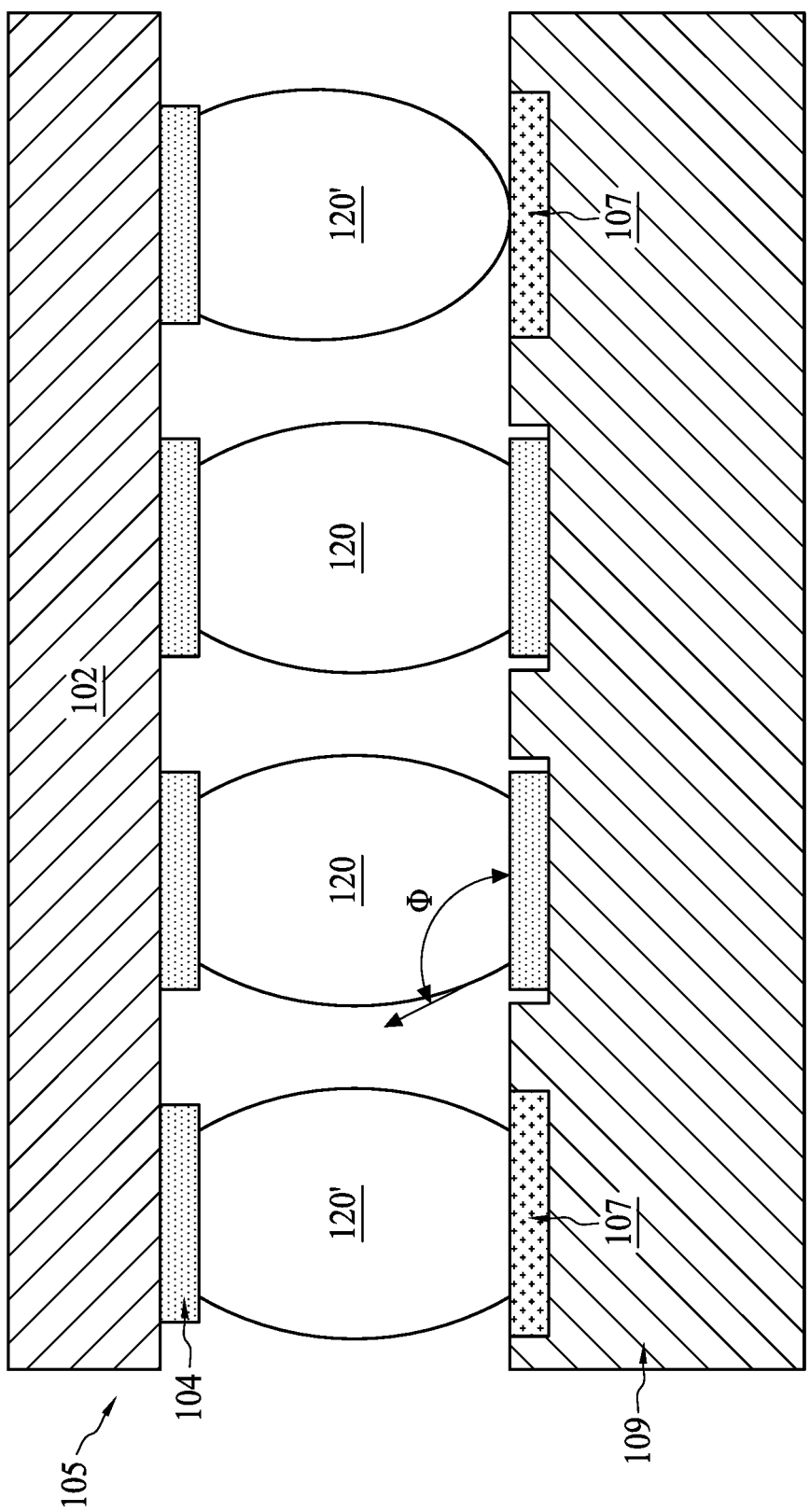
FIG. 7 is the cross sectional view along line AA' in FIG. 4E in accordance some embodiments of the present disclosure.

In some embodiments, the contact areas 108' are replaced with a polymeric pad. As in FIG. 7, some polymeric pads 107 are placed on the top surface 109-1 to be in contact with solder balls. The polymeric pads 107 are formed in various manners. In some embodiments, a polymer layer is coated on the top surface 109-1 and a photolithography operation is performed to from pads 107. In some embodiments, a polymeric material is coated on the top surface 109-1. A photo mask is further placed on the polymeric material followed by an etching. The polymeric is patterned to form the pads 107. In some embodiments, polymer is preformed into several disks and the preformed polymeric disks are placed on the top surface 109-1 in order to form the polymeric pads 107. In some embodiments, polymeric pads 107 are placed in recessed portions of the top surface 109-1. An adhesive may be used to glue the pads 107 on top surface 109-1.

Figure 8A:
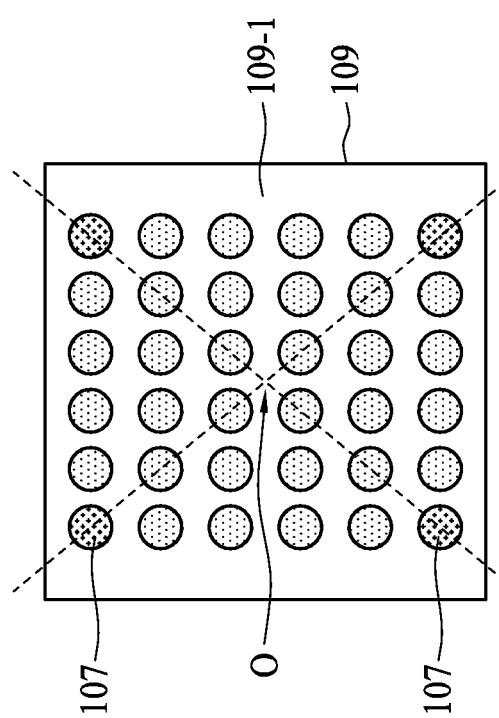
FIGS. 8A-8C are top views of a pad array on a circuit board in accordance some embodiments of the present disclosure.
Figure 8B:
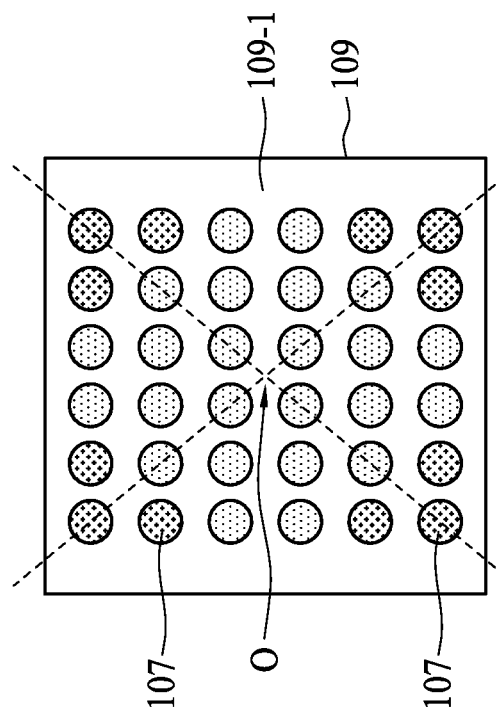
Figure 8C:
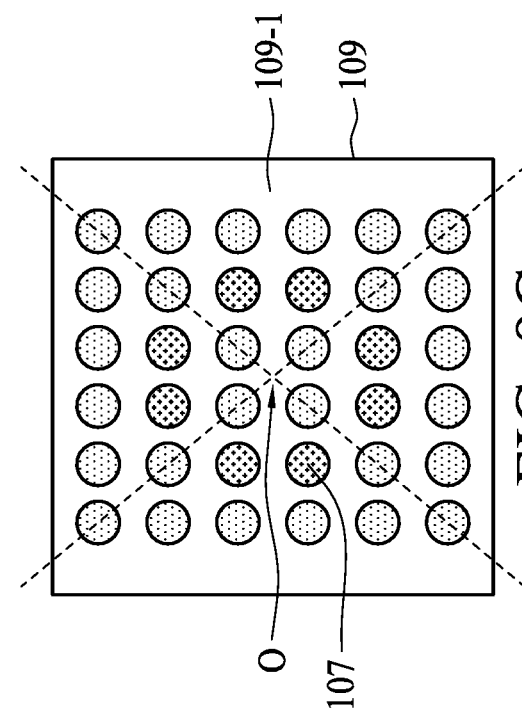

The non-wetted members such as contact area 108' or pads 107 are arranged in various patterns. FIG. 8A to 8C are top views of a circuit board 109 in accordance with some embodiments of present disclosure. On the top surface 109-1, a pad array is formed. In some embodiments, the non-wetted members are arranged symmetrical to a center of the array. As in FIG. 8A, some polymeric pads 107 are arranged at corners of the array. Point O is a visual center point of the array. The non-wetted bumps are formed on the polymeric 107 symmetrically to the center point O. A symmetrical arrangement can help form a more uniform elongated bump in the array. In some embodiments, some polymeric pads 107 are arranged symmetrically at edges and corners of the array as in FIG. 8B. In some embodiments, polymeric pads 107 are arranged inside the array as in FIG. 8C. In some embodiments, the pads 107 are replaced with contact areas 108' (not illustrated), which are also arranged symmetrical to the center O.

In some embodiments, a method for forming a semiconductor structure comprising: providing a semiconductor substrate having a first pad and a second pad on a top surface of the semiconductor substrate; providing a circuit board having an active pad and a non-metallic surface; providing a first solder ball and a second solder ball on the active pad and the non-metallic surface respectively; attaching the first pad and the second pad on the first solder ball and the second solder ball respectively; and reflowing the first solder ball and the second solder ball to form a first bump wetted on the active pad and a second bump not wetted on the non-metallic surface.

In some embodiments, a method for forming a semiconductor structure comprising: providing a semiconductor substrate having a first pad and a second pad on a top surface of the semiconductor substrate; providing a circuit board having an active pad and a non-metallic surface; providing a first solder ball and a second solder ball on the active pad and the non-metallic surface respectively; attaching the first pad and the second pad on the first solder ball and the second solder ball respectively; and reflowing the first solder ball and the second solder ball to form a first bump and a second bump respectively; wherein the first bump is arranged to have a first contact angle formed between a first contact surface of the first bump on the active pad and a surface of the active pad, the second bump is arranged to have a second contact angle formed between a second contact surface of the second bump on the non-metallic surface and a surface of the non-metallic surface, and the first contact angle is different from the second contact angle.

In some embodiments, a method for forming a semiconductor structure comprising: providing a semiconductor substrate, having a plurality of first pads and a plurality of second pads on a top surface of the semiconductor substrate; providing a circuit board having a plurality of active pads and a plurality of non-metallic surfaces; providing a plurality of first solder balls respectively on the plurality of active pads, and a plurality of second solder balls respectively on the plurality of non-metallic surfaces; attaching the plurality of first pads and the plurality of second pads on the plurality of first solder balls and the plurality of second solder balls respectively; and reflowing the plurality of first solder balls and the plurality of second solder balls to form a plurality of first bumps and a plurality of second bumps respectively; wherein the plurality of active pads and the plurality of non-metallic surfaces are formed as an array on the circuit board, and the plurality of non-metallic surfaces are arranged to be symmetrical to a center of the array.

Moreover, the scope of the present application is not intended to be limited to the particular embodiments of the process, machine, manufacture, and composition of matter, means, methods and steps described in the specification. As those skilled in the art will readily appreciate form the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure.

Accordingly, the appended claims are intended to include within their scope such as processes, machines, manufacture, and compositions of matter, means, methods or steps. In addition, each claim constitutes a separate embodiment, and the combination of various claims and embodiments are within the scope of the invention.

What is claimed is:

1. A method for forming a semiconductor structure, comprising:
   providing a semiconductor substrate, having a first active pad and a dummy pad on a first top surface of the semiconductor substrate;
   providing a circuit board having a second active pad and a non-metallic surface, wherein a second top surface of the second active pad is at substantially same level as the non-metallic surface;
   providing a first solder ball and a second solder ball on the second top surface and the non-metallic surface respectively;
   attaching the first active pad and the dummy pad on the first solder ball and the second solder ball respectively; and
   reflowing the first solder ball and the second solder ball to form a first bump wetted on the second top surface and a second bump not wetted on the non-metallic surface, and to elongate the first bump,
   wherein the first active pad and the first bump are electrically connected to an internal circuit of the semiconductor substrate, and the dummy pad and the second bump are electrically insulated from the internal circuit.

2. The method of claim 1, wherein the first bump is substantially taller than the second bump.

3. The method of claim 1, further comprising:
   providing a recessed portion recessed into the circuit board for accommodating the second active pad.

4. The method of claim 1, wherein a first contact angle is formed between a first contact surface of the first bump on the second active pad and the second top surface of the second active pad, a second contact angle is formed between a second contact surface of the second bump on the non-metallic surface and a portion of the non-metallic surface, and the second angle is different from the first angle.

5. The method of claim 4, wherein the first contact angle and the second contact angle are greater than 90 degrees, and the first contact angle is smaller than the second contact angle.

6. The method of claim 1, wherein a first height of the first solder ball is equal to a second height of the second solder ball, and a maximum width of the first bump is different from a maximum width of the second bump.

7. The method of claim 6, wherein the maximum width of the second bump is greater than the maximum width of the first bump.

8. The method of claim 1, wherein the first solder ball has a first amount of solder material, the second solder ball has a second amount of solder material, and the first amount of solder material is equal to the second amount of solder material.

9. A method for forming a semiconductor structure, comprising:
   providing a semiconductor substrate, having a first pad and a second pad on a first top surface of the semiconductor substrate;

providing a circuit board having a conductive pad and an insulative pad, wherein a second top surface of the conductive pad is at substantially same level as a third top surface of the insulative pad;

providing a first solder ball and a second solder ball on the conductive pad and the insulative pad respectively;

attaching the first pad and the second pad on the first solder ball and the second solder ball respectively; and reflowing the first solder ball and the second solder ball to form a first bump and a second bump respectively and to increase an aspect ratio of the first bump, wherein the first bump is arranged to have a first contact angle formed between a first contact surface of the first bump on the conductive pad and a surface of the conductive pad, the second bump is arranged to have a second contact angle formed between a second contact surface of the second bump on the insulative pad and a surface of the insulative pad, and the first contact angle is different from the second contact angle.

10. The method of claim 9, wherein the first contact angle and the second contact angle are greater than 90 degrees, and the first contact angle is smaller than the second contact angle.

11. The method of claim 9, further comprising:
providing a first recessed portion recessed into the surface of the circuit board for accommodating the conductive pad;
providing a second recessed portion recessed into the surface of the circuit board for accommodating the insulative pad.

12. The method of claim 9, wherein a maximum width of the first bump is different from a maximum width of the second bump.

13. The semiconductor structure of claim 12, wherein the maximum width of the second bump is greater than the maximum width of the first bump.

14. A method for forming a semiconductor structure, comprising:
providing a semiconductor substrate, having a plurality of first pads and a plurality of second pads on a first top surface of the semiconductor substrate;
providing a circuit board having a plurality of conductive pads and a plurality of insulative pads, wherein the plurality of conductive pads include a plurality of second top surfaces respectively, the plurality of insulative pads include a plurality of third top surfaces respectively, the plurality of third top surfaces are at substantially higher level than the plurality of second top surfaces;
providing a plurality of first solder balls respectively on the plurality of conductive pads, and a plurality of second solder balls respectively on the plurality of insulative pads;
attaching the plurality of first pads and the plurality of second pads on the plurality of first solder balls and the plurality of second solder balls respectively; and
reflowing the plurality of first solder balls and the plurality of second solder balls to form a plurality of first bumps and a plurality of second bumps respectively and to increase a gap between the semiconductor substrate and the circuit board,
wherein the plurality of conductive pads and the plurality of insulative pads are formed as an array on the circuit board, and the plurality of insulative pads are arranged to be symmetrical to a center of the array.

15. The method of claim 14, further comprising:
forming a plurality of recessed portions recessed into a surface of the circuit board for accommodate the plurality of conductive pads respectively.

16. The method of claim 14, wherein the plurality of insulative pads are formed inside the array.

17. The method of claim 14, wherein the plurality of insulative pads are formed on a plurality of corners of the array respectively.

18. The method of claim 14, wherein the plurality of insulative pads are a plurality of polymeric pads respectively.

19. The method of claim 14, wherein reflowing the plurality of first solder balls and the plurality of second solder balls to form the plurality of first bumps and the plurality of second bumps respectively comprises:
reflowing the plurality of first solder balls and the plurality of second solder balls to form the plurality of first bumps wetted on the plurality of conductive pads and the plurality of second bumps not wetted on the plurality of insulative pads respectively.

20. The method of claim 14, wherein each of the plurality of first solder ball has a first amount of solder material, each of the plurality of second solder ball has a second amount of solder material, and the first amount of solder material is equal to the second amount of solder material.

* * * * *